US009806607B2

(12) United States Patent
Ranmuthu

(10) Patent No.: US 9,806,607 B2
(45) Date of Patent: Oct. 31, 2017

(54) CIRCUIT FOR CONTROLLING A POWER SUPPLY VOLTAGE FOR A HIGH-SIDE GATE DRIVER

(71) Applicant: Texas Instruments Incorporated, Dallas, TX (US)

(72) Inventor: Indumini W. Ranmuthu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 14/849,562

(22) Filed: Sep. 9, 2015

(65) Prior Publication Data

US 2016/0072382 A1    Mar. 10, 2016

Related U.S. Application Data

(60) Provisional application No. 62/048,409, filed on Sep. 10, 2014.

(51) Int. Cl.
*H02M 3/07* (2006.01)
*H02M 1/08* (2006.01)
*G05F 5/00* (2006.01)

(52) U.S. Cl.
CPC ............. *H02M 3/07* (2013.01); *H02M 1/08* (2013.01); *G05F 5/00* (2013.01); *H03K 2217/0063* (2013.01); *H03K 2217/0081* (2013.01)

(58) Field of Classification Search
CPC ............. H02M 3/07; H02M 1/08; G05F 5/00
See application file for complete search history.

(56) References Cited

U.S. PATENT DOCUMENTS

| 5,808,883 | A | * | 9/1998 | Hawkes | H02M 3/07 363/60 |
| 6,531,895 | B1 | * | 3/2003 | Barrett | H03K 17/063 326/82 |
| 7,129,678 | B2 |  | 10/2006 | Cheng | |
| 2012/0187934 | A1 |  | 7/2012 | Suzuki | |
| 2013/0026829 | A1 | * | 1/2013 | Kartal | H03K 17/063 307/10.6 |
| 2013/0272547 | A1 | * | 10/2013 | Waller, Jr. | H04R 3/00 381/120 |
| 2014/0217959 | A1 |  | 8/2014 | Chen et al. | |
| 2015/0326114 | A1 | * | 11/2015 | Rolland | H03K 17/063 307/31 |
| 2016/0072382 | A1 | * | 3/2016 | Ranmuthu | H02M 3/07 363/60 |

OTHER PUBLICATIONS

Search Report for PCT/US 2015/049487, mailed Dec. 10, 2015, 2 pages.

* cited by examiner

*Primary Examiner* — Jue Zhang
*Assistant Examiner* — Lakaisha Jackson
(74) *Attorney, Agent, or Firm* — Gregory J. Albin; Charles A. Brill; Frank D. Cimino

(57) ABSTRACT

This disclosure describes techniques for controlling a power supply voltage for a high-side gate driver that is used in a power converter. In some examples, in response to an overvoltage condition that occurs on an input voltage lead of a power converter, a power converter may decouple a terminal of a charge pump capacitor from the input voltage lead, and couple the terminal of the capacitor to a reference voltage lead. In further examples, in response to an overvoltage condition that occurs on an input voltage lead of a power converter, a power converter may turn off both switching transistors.

17 Claims, 8 Drawing Sheets

CIRCUIT FOR CONTROLLING A POWER SUPPLY VOLTAGE FOR A HIGH-SIDE GATE DRIVER

This application claims the benefit of U.S. Provisional Application No. 62/048,409, filed Sep. 10, 2014, the entire content of which is incorporated herein by reference.

TECHNICAL FIELD

The disclosure relates to electrical circuits, and in particular to power converters.

BACKGROUND

Automotive load dump refers to the disconnection of a vehicle battery from the alternator while the battery is being charged. Such a disconnection may cause high voltages to occur in the power conversion circuits for the automotive electronics, which may in turn damage components in the power conversion circuits.

SUMMARY

According to some aspects of this disclosure, an integrated circuit includes an input voltage lead, a high-side gate drive output lead, a first charge pump capacitor lead, a second charge pump capacitor lead, and a reference voltage lead. The integrated circuit further includes charge pump circuitry having an input, and an output coupled to the second charge pump capacitor lead. The integrated circuit further includes a gate driver having a control input, a power input coupled to the output of the charge pump circuitry, and an output coupled to the high-side gate drive output lead. The integrated circuit further includes a switching circuit having a control input, a first terminal coupled to the reference voltage lead, a second terminal coupled to the input voltage lead, and a third terminal coupled to the first charge pump capacitor lead. The integrated circuit further includes an overvoltage detection circuit having an input coupled to the input voltage lead, and an output coupled to the control input of the switching circuit.

According to additional aspects of this disclosure, a method includes selectively coupling a charge pump capacitor lead to an input voltage lead or a reference voltage lead based on whether an overvoltage condition is detected for the input voltage lead. The input voltage lead is coupled to a power supply input of a gate driver.

According to additional aspects of this disclosure, an automotive system includes one or more automotive electronic components. The automotive system further includes an automotive battery. The automotive system further includes an alternator coupled to the battery. The automotive system further includes a power supply rail coupled to the alternator. The automotive system further includes a power converter coupled between the power supply rail and the automotive electronic components. The power converter includes a pass transistor. The power converter further includes a gate driver coupled to the pass transistor. The power converter further includes a capacitor having a first terminal coupled to a power input of the gate driver. The power converter further includes circuitry configured to decouple a second terminal of the capacitor from the power supply rail in response to detecting an overvoltage condition on the power supply rail, and to couple the second terminal of the capacitor to a reference voltage lead in response to detecting the overvoltage condition on the power supply rail.

According to additional aspects of this disclosure, an integrated circuit includes an input voltage lead, a high-side gate drive output lead, and a low-side gate drive output lead. The integrated circuit further includes a high-side gate driver having an input, and an output coupled to the high-side gate drive output lead. The integrated circuit further includes a low-side gate driver having an input, and an output coupled to the low-side gate drive output lead. The integrated circuit further includes a control circuit having an input, a first output coupled to the input of the high-side gate driver, and a second output coupled to the input of the low-side gate driver. The integrated circuit further includes an overvoltage detection circuit having an input coupled to the input voltage lead, and an output coupled to the input of the control circuit. The control circuit is configured to output a first control signal, via the first output, that causes a high-side switching transistor to turn off in response to detecting an overvoltage condition for a voltage carried by the input voltage lead, and to output a second control signal, via the second output, that causes a low-side switching transistor to turn off in response to detecting the overvoltage condition for the voltage carried by the input voltage lead.

According to additional aspects of this disclosure, a method includes detecting an overvoltage condition on an input voltage lead of a switch mode power converter that includes a high-side switching transistor and a low-side switching transistor. The method further includes turning off the high-side switching transistor and the low-side switching transistor in response to detecting the overvoltage condition.

DETAILED DESCRIPTION

Figure 1:
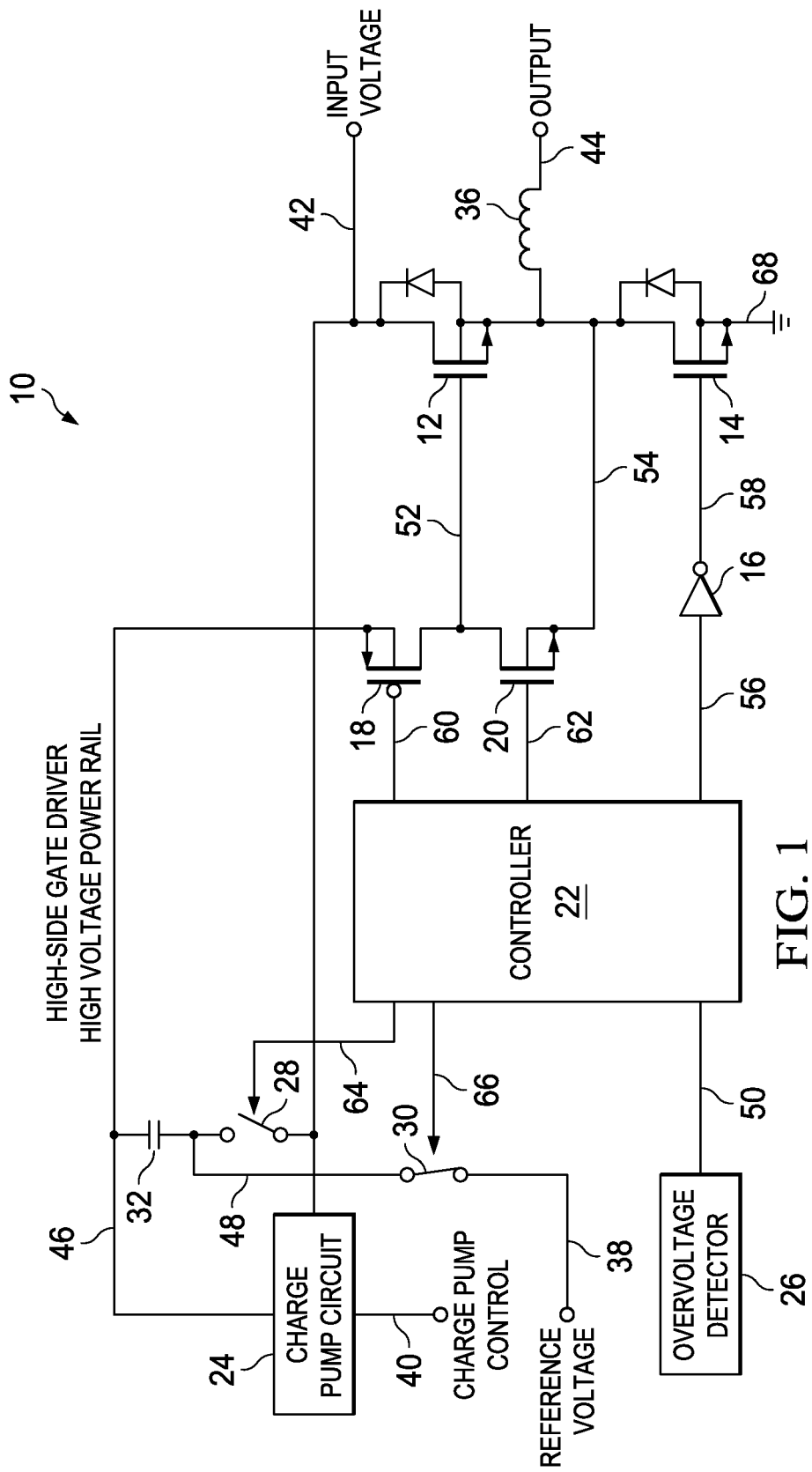
FIG. 1 is a block diagram illustrating an example power converter that includes an example power converter control circuit according to this disclosure.

This disclosure describes techniques for controlling a power supply voltage for a high-side gate driver that is used in a power converter. The control techniques may, in response to an overvoltage condition that occurs on the input voltage lead of a power converter, change the configuration and/or operation of the power converter control circuitry to reduce the level of voltage that is supplied to the high-side gate driver relative to the level of voltage that would otherwise be supplied during normal operating conditions. In this way, the voltage supplied to a high-side gate driver may be limited to levels that will not cause damage to the gate driver or other circuitry, even in cases where there is an overvoltage condition in a power converter.

Reducing the level of voltage that is supplied to a high-side gate driver during an overvoltage condition may reduce the voltage compliance requirements needed for the components and/or the semiconductor fabrication process that implement the power converter. This may allow existing components and processes to be used to implement power converters for relatively high input voltages which would otherwise not be possible with unmodified gate driver voltages. In this way, power converters that support relatively high-input voltages may be obtained without requiring specialized, very-high compliance voltage components and/or processes.

Moreover, reducing the voltage compliance requirements for the components and processes may allow cheaper and/or more area-efficient components and/or processes to be used for implementing a power converter. In this way, the cost and size of a power converter may be reduced.

In some examples, a power converter control circuit may include a charge pump circuit that uses a capacitor coupled between the input voltage of the power converter and the gate driver power supply. The charge pump circuit may use a charge pump capacitor to superimpose a voltage on top of the input voltage. In such examples, the techniques of this disclosure may, in response to an overvoltage condition that occurs on the input voltage lead of the power converter, decouple a terminal of the charge pump capacitor from the input voltage lead, and couple the terminal of the capacitor to a reference voltage lead. The reference voltage lead may carry a reference voltage that is less than or equal to a difference between a voltage carried by the input voltage lead during the overvoltage condition and a maximum voltage to which a charge pump is configured to charge a charge pump capacitor.

Selectively decoupling the capacitor from the input voltage lead and coupling the capacitor to a reference voltage in this manner may prevent the charge pump from raising the power supply rail of the high-side gate driver to a voltage that is even greater than the voltage carried by the input voltage lead during the overvoltage condition. In this way, the voltage supplied to a high-side gate driver may be limited to levels that will not cause damage to the gate driver or other circuitry, even in cases where there is an overvoltage condition on the input voltage lead of the power converter.

In further examples, a power converter control circuit may include a capacitor coupled between the low and high voltage power rails of the high-side gate driver circuit, and a diode coupled between the high voltage power rail of the gate driver circuit and a voltage source. The diode and capacitor may operate together to maintain a voltage across the high-side gate driver when the output voltage of the power converter is increasing. In such examples, the techniques of this disclosure may, in response to an overvoltage condition that occurs on an input voltage lead of a power converter, turn off both the high-side and low-side power converter switches.

Turning off the high-side and low-side power converter switches may prevent the diode and capacitor from raising the power supply rail of the high-side gate driver to a voltage that is even greater than the voltage carried by the input voltage lead during the overvoltage condition. In this way, the voltage supplied to a high-side gate driver may be limited to levels that will not cause damage to the gate driver or other circuitry, even in cases where there is an overvoltage condition on the input voltage lead of a power converter.

Automotive load dump may refer to the disconnection of a vehicle battery from the alternator while the battery is being charged. Such a disconnection may cause high voltages to occur in the input voltage lead of a power conversion circuit, which may in turn cause the power supply rail of the high-side gate driver to increase to an even higher voltage. This may cause damage to the gate driver or other components on the power converter integrated circuit.

The techniques of this disclosure may change the configuration and/or operation of the power converter control circuitry to reduce the level of voltage that is supplied to the high-side gate driver so that it is less than or equal to the maximum specified automotive load dump voltage. In this way, the voltage supplied to a high-side gate driver may be limited to levels that will not cause damage to the gate driver or other circuitry, even in cases where there is an overvoltage condition due to automotive load dump.

FIG. 1 is a block diagram illustrating an example power converter 10 that includes an example power converter control circuit according to this disclosure. Power converter 10 includes a high-side switching transistor 12, a low-side switching transistor 14, a low-side gate driver 16, transistors 18, 20, a controller 22, a charge pump circuit 24, an overvoltage detector 26, switches 28, 30, a charge pump capacitor 32, an inductor 36, leads 38, 40, 42, 44 and conductors 46, 48, 50, 52, 54, 56, 58, 60, 62, 64, 66.

A source electrode of high-side switching transistor 12 is coupled to a drain electrode of low-side switching transistor 14 via conductor 54. A drain electrode of high-side switching transistor 12 is coupled to input voltage lead 42. A source electrode of low-side switching transistor 14 is coupled to ground rail 68. Switching transistors 12, 14 may be said to be arranged in a totem-pole configuration, and may form a half-bridge circuit where input voltage lead 42 forms the input voltage terminal, the source of low-side switching transistor 14 forms the ground return terminal, and conductor 54 forms the output voltage terminal. Input voltage lead 42 is configured to be coupled to an input voltage source such as, e.g., an automotive battery and/or an automotive alternator.

In the example of FIG. 1, the output voltage terminal formed by conductor 54 is coupled to output lead 44 via inductor 36, and output lead 44 may form an output terminal for power converter 10. Output lead 44 is configured to be coupled to one or more electronic load components, such as, e.g., one or more automotive electronic components. In some examples, the output voltage terminal formed by conductor 54 may be coupled to an electric motor, and inductor 36 may represent the internal inductance of the electric motor.

The gate electrode of each of switching transistors 12, 14 is coupled to a respective gate driver circuit. Specifically, a gate electrode of high-side switching transistor 12 is coupled, via conductor 52, to an output of a high-side gate driver formed by transistors 18, 20. A gate electrode of low-side switching transistor 14 is coupled to an output of low-side gate driver 16 via conductor 58.

Back gate electrodes of each of switching transistors 12, 14 are coupled to their respective source electrodes via conductors. Internal diodes included in each of switching transistors 12, 14 are coupled between respective back gate and drain electrodes of switching transistors 12, 14 where the anodes are coupled to respective back gate electrodes and the cathodes are coupled to respective drain electrodes.

A drain electrode of transistor 18 is coupled to a drain electrode of transistor 20 via conductor 52. A source terminal of transistor 20 is coupled, via conductor 54, to the voltage output of the half-bridge circuit formed by switching transistors 12, 14. A source electrode of transistor 18 is coupled to charge pump capacitor 32 and to an output of charge pump circuit 24 via conductor 46. Transistors 18, 20 may collectively form a high-side gate driver, which in some examples may be an inverter.

The high-side gate driver formed by transistors 18, 20 includes a high voltage power input formed by the source of transistor 18 and coupled to conductor 46 (referred to herein as a high-side gate driver high voltage power rail). The high-side gate driver further includes a low voltage power input formed by the source of transistor 20 and coupled to the voltage output of the half-bridge circuit (referred to herein as a high-side gate driver low voltage power rail).

The gate electrodes of transistors 18, 20 are coupled to respective outputs of controller 22 via conductors 60, 62, respectively. Each of conductors 60, 62 may form an input to the high-side gate driver, and may be collectively referred to as a control input for the high-side gate driver. Back gate electrodes of each of transistors 18, 20 are coupled to their respective source electrodes via conductors.

An input of low-side gate driver 16 is coupled to another output of controller 22 via conductor 56. In some examples, low-side gate driver 16 may be an inverter.

A control input of charge pump circuit 24 is coupled to charge pump control lead 40. A voltage input of charge pump circuit 24 is coupled to input voltage lead 42. An output of charge pump circuit 24 is coupled, via conductor 46, to a first terminal of charge pump capacitor 32 and to the high voltage power supply input of the high-side gate driver.

Switch 28 is coupled between a second terminal of charge pump capacitor 32 and input voltage lead 42. Switch 30 is coupled between the second terminal of charge pump capacitor 32 and reference voltage lead 38. Specifically, a first terminal of switch 28 is coupled to the second terminal of charge pump capacitor 32 via conductor 48, and a second terminal of switch 28 is coupled to input voltage lead 42. A first terminal of switch 30 is coupled to the second terminal of charge pump capacitor 32 via conductor 48, and a second terminal of switch 28 is coupled to reference voltage lead 38. The first terminals of switches 28, 30 are coupled to each other via conductor 48. Control terminals of switches 28, 30 are coupled to respective outputs of controller 22 via conductors 64, 66, respectively.

Overvoltage detector 26 includes an input that is coupled to input voltage lead 42 (not shown), and an output that is coupled to controller 22 via conductor 50. One or more of the components in FIG. 1 may be implemented on a common integrated circuit.

In the example of FIG. 1, switching transistors 12, 14 are both n-type metal-oxide-semiconductor (NMOS) power transistors. In other examples, each of switching transistors 12, 14 may be a different type of transistor (e.g., insulated-gate bipolar junction transistor (IBJT)) with the same or different type of conductivity (e.g., p-type or n-type). Switching transistors 12, 14 need not be the same type or polarity of transistor with respect to each other.

Transistor 18 is a PMOS transistor, and transistor 20 is an NMOS transistor. In some examples, transistors 18, 20 may be relatively low-voltage transistors (i.e., non-power transistors). Other transistor configurations that are configured to implement an inverter and/or high-side gate driver may also be used.

Controller 22 and overvoltage detector 26 may be implemented with any combination of analog or digital circuitry, including for example, a microcontroller. Charge pump circuit 24 may, in some examples, be implemented with one or more diodes.

Reference voltage lead 38 is configured to be coupled to a reference voltage source. Charge pump control lead 40 is configured to be coupled to the output of a charge pump controller.

Power converter 10 may be configurable to operate in a normal mode of operation and an overvoltage protection mode of operation. During the normal mode of operation, controller 22 controls switches 28, 30 via conductors 64, 66 such that switch 28 is closed and switch 30 is open. This causes the lower terminal of charge pump capacitor 32 to be coupled to input voltage lead 42 and to be disconnected from reference voltage lead 38.

During the normal mode of operation, charge pump circuit 24 charges charge pump capacitor 32 based on an input voltage carried by input voltage lead 42 and based on a charge pump control signal carried by charge pump control lead 40. Charge pump circuit 24 may charge charge pump capacitor 32 until a voltage across charge pump capacitor 32 is equal to a target voltage. In some examples, the target voltage may be greater than or equal to a gate-to-source turn-on threshold voltage for high-side switching transistor 12.

During the normal mode of operation, controller 22 provides control signals (e.g., pulse-width modulation (PWM) control signals) to the high-side gate driver formed by transistors 18, 20 and to low-side gate driver 16. In the example of FIG. 1, controller 22 may provide a high-side control signal to transistor 18 via conductor 60 and to transistor 20 via conductor 62. The high-side gate driver formed by transistors 18, 20 may generate sufficient voltage and current to turn on and off high-side switching transistor 12 based on the high-side control signal provided by controller 22. Controller 22 may provide a low-side control signal to low-side gate driver 16 via conductor 56. Low-side gate driver 16 may generate sufficient voltage and current turn on and off low-side switching transistor 14 based on the low-side control signal provided by controller 22.

Transistors 18, 20 may act as an inverter with a floating ground power supply (i.e., conductor 54). For example, in response to receiving a high logic level voltage on conductors 60, 62, transistor 20 may turn on and transistor 18 may turn off. This may cause conductor 52 to be coupled to conductor 54, thereby turning off high-side switching transistor 12. In response to receiving a low logic level voltage on conductors 60, 62, transistor 20 may turn off and transistor 18 may turn on. This may cause conductor 52 to be coupled to the high-side gate driver high voltage power rail, thereby turning on high-side switching transistor 12.

Controller 22 may generate control signals that are appropriate for the intended use of power converter 10. For example, power converter 10 may generate control signals (e.g., PWM control signals) that cause switching transistors 12, 14, inductor 36 and an additional capacitor (not shown) coupled between output lead 44 and ground to act as a synchronous buck converter. In such examples, power converter 10 may generate the control signals based on a feedback signal indicative of the output voltage level relative to a target voltage level. As another example, power converter 10 may generate control signals (e.g., PWM control signals) that are configured to drive a single phase of a multi-phase electric motor. Other types of control signals and applications are also possible.

During the normal mode of operation, overvoltage detector 26 may monitor the voltage level carried by input voltage lead 42 and determine whether an overvoltage condition has occurred on input voltage lead 42. In some examples, overvoltage detector 26 may determine that an overvoltage condition has occurred in response to detecting that the voltage carried by input voltage lead 42 is greater a threshold voltage.

In some examples, the threshold voltage may be less than or equal to a maximum compliance voltage for one or more of the components in power converter 10. In further examples, the threshold voltage may be less than the peak overvoltage specified for the input voltage lead 42 minus a maximum voltage to which charge pump capacitor 32 is configured to charge charge pump capacitor 32. In some examples, the peak overvoltage may correspond to a specified automotive load dump voltage level. Overvoltage detector 26 may generate a signal indicative of whether an overvoltage condition has occurred on input voltage lead 42, and provide the signal to controller 22 via conductor 50.

In response to detecting an overvoltage condition, power converter 10 may transition from the normal mode of operation to an overvoltage protection mode of operation. To transition from the normal mode to the overvoltage protection mode, controller 22 may open switch 28 and close switch 30, thereby decoupling the lower terminal of charge pump capacitor 32 from input voltage lead 42 and coupling the lower terminal of charge pump capacitor 32 to reference voltage lead 38.

During the overvoltage protection mode, controller 22 may, in some examples, disable the delivery of control signals to the high-side gate driver formed by transistors 18, 20 and low-side gate driver 16. In further examples, controller 22 may continue to deliver control signals to the high-side gate driver formed by transistors 18, 20 and low-side gate driver 16.

Overvoltage detector 26 may continue to monitor the voltage level carried by input voltage lead 42 during the overvoltage protection mode, and determine when the overvoltage condition has ceased. In some examples, overvoltage detector 26 may determine that an overvoltage condition has ceased in response to detecting that the voltage carried by input voltage lead 42 is less than a threshold voltage.

In response to detecting that an overvoltage condition has ceased, power converter 10 may transition from the overvoltage protection mode of operation back to the normal mode of operation. To transition from the overvoltage protection mode of operation back to the normal mode of operation, controller 22 may open switch 30 and close switch 28, thereby decoupling the lower terminal of charge pump capacitor 32 from reference voltage lead 38 and coupling the lower terminal of charge pump capacitor 32 to input voltage lead 42.

Reference voltage lead 38 may carry a reference voltage that is less than or equal to a difference between a voltage carried by input voltage lead 42 during the overvoltage condition and a maximum voltage to which charge pump capacitor 32 is configured to charge charge pump capacitor 32. In some examples, the reference voltage may be equal to the difference between the voltage carried by input voltage lead 42 during the overvoltage condition and a maximum voltage to which charge pump capacitor 32 is configured to charge charge pump capacitor 32. In some cases, the voltage carried by input voltage lead 42 during the overvoltage condition may be an estimate of the voltage carried by input voltage lead 42 during the overvoltage condition. For example, the voltage may correspond to a specified maximum automotive load dump voltage.

Selectively decoupling a terminal of charge pump capacitor 32 from input voltage lead 42 and coupling the terminal of charge pump capacitor 32 to a reference voltage in this manner may prevent charge pump circuit 24 from raising the power supply rail of the high-side gate driver to a voltage that is even greater than the voltage carried by input voltage lead 42 during an overvoltage condition. In this way, the voltage supplied to a high-side gate driver may be limited to levels that will not cause damage to the gate driver or other circuitry, even in cases where there is an overvoltage condition on input voltage lead 42 of power converter 10.

Reducing the level of voltage that is supplied to a high-side gate driver during an overvoltage condition may reduce the voltage compliance requirements needed for the components and/or the semiconductor fabrication process that implement power converter 10. This may allow existing components and processes to be used to implement power converters for relatively high input voltages which would otherwise not be possible with unmodified gate driver voltages. In this way, power converters that support relatively high-input voltages may be obtained without requiring specialized, very-high compliance voltage components and/or processes.

Moreover, reducing the voltage compliance requirements for the components and processes may allow cheaper and/or more area-efficient components and/or processes to be used for implementing a power converter. In this way, the cost and size of power converter 10 may be reduced.

Figure 2:
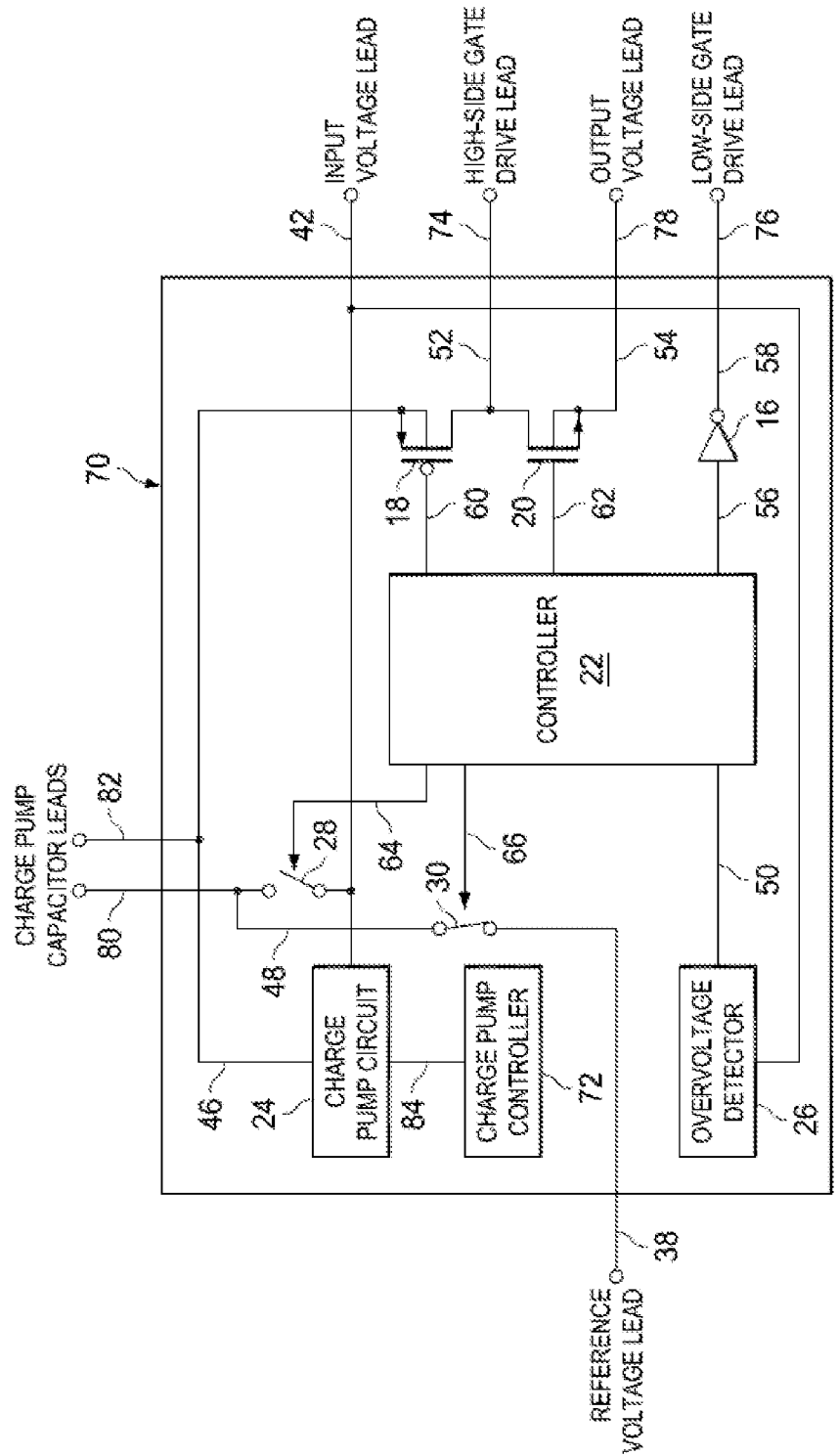
FIG. 2 is a block diagram illustrating an example integrated circuit that includes a power converter control circuit which may be used in the power converter of FIG. 1.

FIG. 2 is a block diagram illustrating an example integrated circuit 70 that includes a power converter control circuit which may be used in power converter 10 of FIG. 1. Integrated circuit 70 includes a low-side gate driver 16, transistors 18, 20, a controller 22, a charge pump circuit 24, a charge pump controller 72, an overvoltage detector 26, switches 28, 30, leads 38, 42, 74, 76, 78, 80, 82 and conductors 46, 48, 50, 52, 54, 56, 58, 60, 62, 64, 66, 84.

Integrated circuit 70 is similar to power converter 10 of FIG. 1 except that: (1) switching transistors 12, 14, charge pump capacitor 32, and inductor 36 are off-chip components that are not included in integrated circuit 70; (2) high-side gate drive lead 74, low-side gate drive lead 76 and charge pump capacitor leads 80, 82 are included to accommodate the off-chip components; and (3) charge pump controller 72 is included to control charge pump circuit 24. Same or similar components between FIGS. 1 and 2 are numbered with identical reference numerals.

A drain electrode of transistor 18 is coupled to a drain electrode of transistor 20 via conductor 52. Transistors 18, 20 may form a high-side gate driver. The drains of transistors 18, 20 may form the output of the gate driver, which is coupled to high-side gate drive lead 74 via conductor 52. Conductor 58 is configured to be coupled to the gate electrode of a high-side switching device (e.g., a high-side NMOS power transistor).

Each of the gate electrodes of transistors 18, 20 may form an input to the high-side gate driver, and may be collectively referred to as a control input for the high-side gate driver. The gate electrodes of transistors 18, 20 are coupled to respective outputs of controller 22 via conductors 60, 62, respectively. Back gate electrodes of each of transistors 18, 20 are coupled to their respective source electrodes via conductors.

The high-side gate driver formed by transistors 18, 20 includes a high voltage power input formed by the source of transistor 18 and coupled to charge pump capacitor lead 82 via conductor 46 (referred to herein as a high-side gate driver high voltage power rail). The high-side gate driver formed by transistors 18, 20 further includes a low voltage power input formed by the source of transistor 20 and coupled to output voltage lead 78 via conductor 54 (referred to herein as a high-side gate driver low voltage power rail). Output voltage lead 78 is configured to be coupled to the output voltage node of a half-bridge circuit formed by two power transistors.

An input of low-side gate driver 16 is coupled to another output of controller 22 via conductor 56. The output of low-side gate driver 16 is coupled to low-side gate drive lead 76 via conductor 58. Low-side gate drive lead 76 is configured to be coupled to the gate electrode of a low-side switching device (e.g., a low-side NMOS power transistor).

Input voltage lead 42 is configured to be coupled to an input voltage source such as, e.g., an automotive battery and/or an automotive alternator. Output voltage lead 78 is configured to be coupled to one or more electronic load components, such as, e.g., one or more automotive electronic components and/or an electric motor.

A voltage input of charge pump circuit 24 is coupled to input voltage lead 42. An output of charge pump circuit 24 is coupled, via conductor 46, to charge pump capacitor lead 82 and to the high voltage power supply input of the high-side gate driver. An output of charge pump controller 72 is coupled to a control input of charge pump circuit 24 via conductor 84.

Switch 28 is coupled between charge pump capacitor lead 80 and input voltage lead 42. Switch 30 is coupled between charge pump capacitor lead 80 and reference voltage lead 38. Specifically, a first terminal of switch 28 is coupled to charge pump capacitor lead 80 via conductor 48, and a second terminal of switch 28 is coupled to input voltage lead 42. A first terminal of switch 30 is coupled to charge pump capacitor lead 80 via conductor 48, and a second terminal of switch 28 is coupled to reference voltage lead 38. The first terminals of switches 28, 30 are coupled to each other via conductor 48. Control terminals of switches 28, 30 are coupled to respective outputs of controller 22 via conductors 64, 66, respectively.

Each of charge pump capacitor leads 80, 82 is configured to be coupled to a respective terminal of an external charge pump capacitor. Overvoltage detector 26 includes an input that is coupled to input voltage lead 42 (not shown), and an output that is coupled to controller 22 via conductor 50.

Charge pump controller 72 may generate a charge pump control signal, and provide the charge pump control signal to charge pump circuit 24 via conductor 84. In some examples, charge pump controller 72 may detect the voltage between charge pump capacitor leads 80, 82 and cause charge pump to charge a charge pump capacitor coupled between charge pump capacitor leads 80, 82 until the voltage between charge pump capacitor leads 80, 82 (i.e., the voltage across the capacitor) is equal to a threshold voltage. In some examples, the threshold voltage may be a voltage that is greater than or equal to a gate-to-source turn-on threshold voltage for high-side switching transistor 12.

When the appropriate external components are connected to integrated circuit 70, the resulting system may operate in a manner similar to that which was already described above with respect to power converter 10 of FIG. 1. For purposes of brevity, the description of such operation will not be reproduced here.

Figure 3:
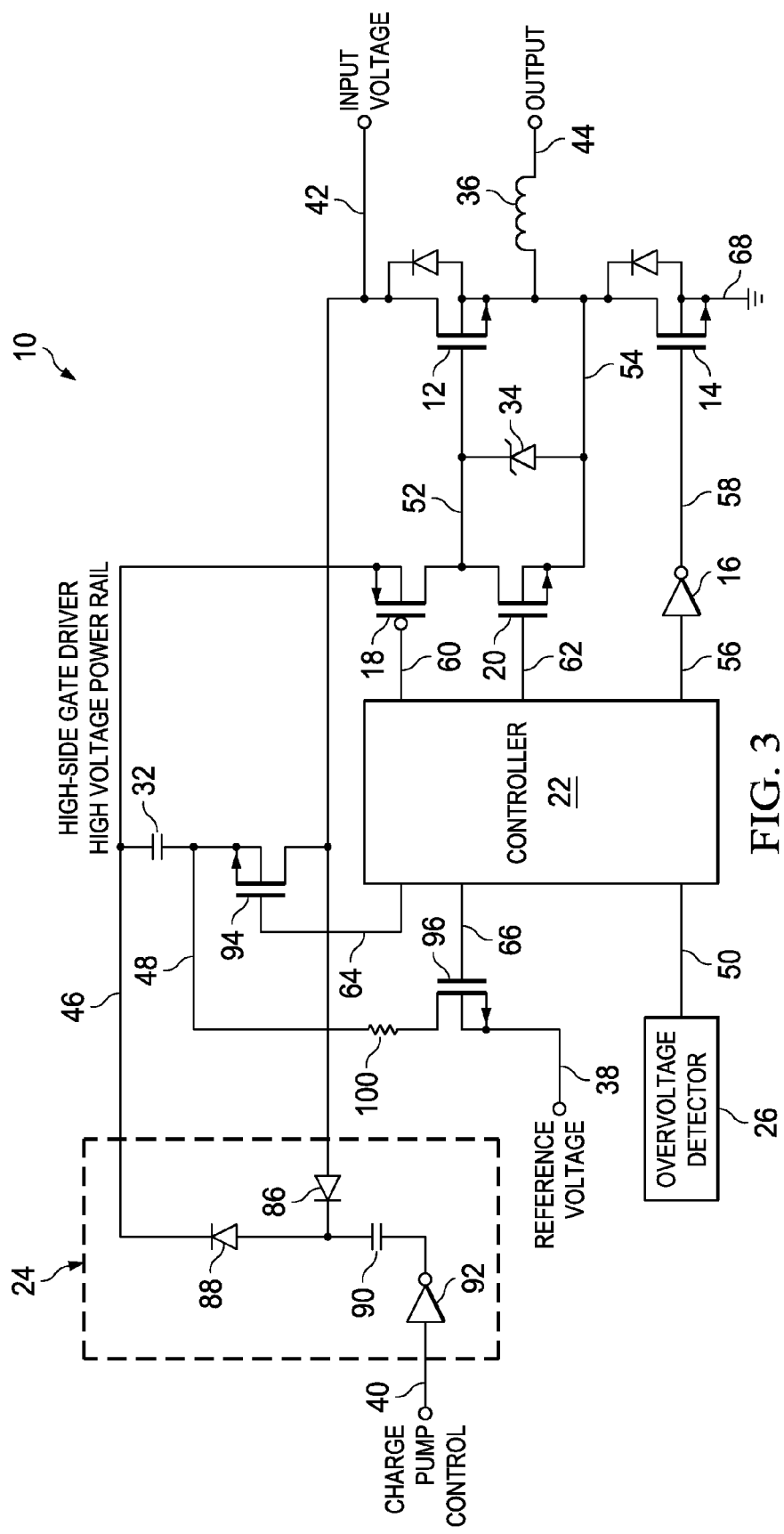
FIG. 3 is a block diagram illustrating the example power converter of FIG. 1 with further details according to this disclosure.

FIG. 3 is a block diagram illustrating the example power converter 10 of FIG. 1 with further details according to this disclosure. Power converter 10 in FIG. 3 is similar to power converter 10 of FIG. 1 except that: (1) further details regarding an example charge pump circuit 24 are shown; (2) further details regarding an example switching circuit to implement switches 28, 30 in FIG. 1 are shown; and (3) a zener diode 34 is coupled between the gate and source electrodes of high-side switching transistor 12. Same or similar components between FIGS. 1 and 3 are numbered with identical reference numerals.

As shown in FIG. 3, a cathode of zener diode 34 is coupled to a gate electrode of high-side switching transistor 12 via conductor 52, and an anode of zener diode 34 is coupled to a source electrode of high-side switching transistor 12 via conductor 54. Zener diode 34 is further coupled between the drain and source electrodes of transistor 20. Specifically, a cathode of zener diode 34 is coupled to the drain electrode of transistor 20 via conductor 52, and an anode of zener diode 34 is coupled to the source electrode of transistor 20 via conductor 54. Zener diode 34 may prevent the gate-to-source voltage of high-side switching transistor 12 from exceeding a break-down voltage. In some examples, zener diode 34 may be omitted from power converter 10.

As shown in FIG. 3, charge pump circuit 24 includes diodes 86, 88, a capacitor 90, and inverter 92. An anode of diode 86 is coupled to input voltage lead 42. A cathode of diode 86 is coupled to an anode of diode 88 and a first terminal of capacitor 90. A cathode of diode 88 is coupled to a first terminal of charge pump capacitor 32 and to the high-side gate driver high voltage power rail via conductor 46. An input of inverter 92 is coupled to charge pump control lead 40. An output of inverter 92 is coupled to a second terminal of capacitor 90.

During operation, charge pump circuit 24 may switch between an internal charging phase and a charge transfer phase based on a charge pump control signal carried by charge pump control lead 40. Charge pump circuit 24 may operate in the internal charging phase in response to the charge pump control signal being equal to a high logic level voltage. During the internal charging phase, inverter 92 inverts the charge pump control signal to generate a low logic level voltage, and applies the low logic level voltage to the second terminal of capacitor 90. The low logic level voltage may be lower than the voltage carried by input voltage lead 42, thereby causing diode 86 to be forward-biased and capacitor 90 to charge. Diode 88 may be reversed biased.

Charge pump circuit 24 may operate in the charge transfer phase in response to the charge pump control signal transferring to a low logic level voltage. During the charge transfer phase, inverter 92 inverts the charge pump control signal to generate a high logic level voltage, and applies the high logic level voltage to the second terminal of capacitor 90. The high logic level voltage combined with the charge stored on capacitor 90 may cause diode 88 to be forward-biased, thereby transferring charge from capacitor 90 to charge pump capacitor 32. Diode 86 may be reversed biased. Charge pump circuit 24 continues transferring charge until the charge pump control signal transitions back to the high logic level voltage. In some examples, a charge pump controller may cause charge pump control signal transitions back to the high logic level voltage in response to detecting that the voltage across charge pump capacitor 32 has reached a threshold voltage (e.g., a voltage greater than or equal to a gate-to-source turn-on threshold voltage of high-side switching transistor 12).

As also shown in FIG. 3, transistors 94, 96 may implement, respectively, switches 28, 30 shown in FIG. 1. Each of transistors 94, 96 is an NMOS transistor, although other types of transistors with other conductivities may be used. A drain electrode of transistor 94 is coupled to input voltage lead 42. A source electrode of transistor 94 is coupled to a second terminal of charge pump capacitor 32 via conductor 48. A source electrode of transistor 96 is coupled to reference voltage lead 38. A drain electrode of transistor 96 is coupled to the second terminal of charge pump capacitor 32 via resistor 100 and conductor 48. Resistor 100 is coupled between the second terminal of charge pump capacitor 32 and the drain electrode of transistor 96. Gate electrodes of transistors 94, 96 are coupled to respective outputs of controller 22 via conductors 64, 66, respectively.

When transitioning to the normal mode of operation, controller 22 may assert control signals via conductors 64, 66 to turn on transistor 94 and turn off transistor 96. For example, controller 22 may output a high voltage level via conductor 64 and a low voltage level via conductor 66. During the normal mode of operation, transistor 94 may couple the lower terminal of charge pump capacitor 32 to input voltage lead 42.

When transitioning to the overvoltage protection mode of operation, controller 22 may assert control signals via conductors 64, 66 to turn off transistor 94 and turn on transistor 96. For example, controller 22 may output a low voltage level via conductor 64 and a high voltage level via conductor 66. During the overvoltage protection mode of operation, transistor 96 may couple the lower terminal of charge pump capacitor 32 to reference voltage lead 38. Resistor 100 may limit the current between the lower terminal of charge pump capacitor 32 and reference voltage lead 38.

Figure 4:
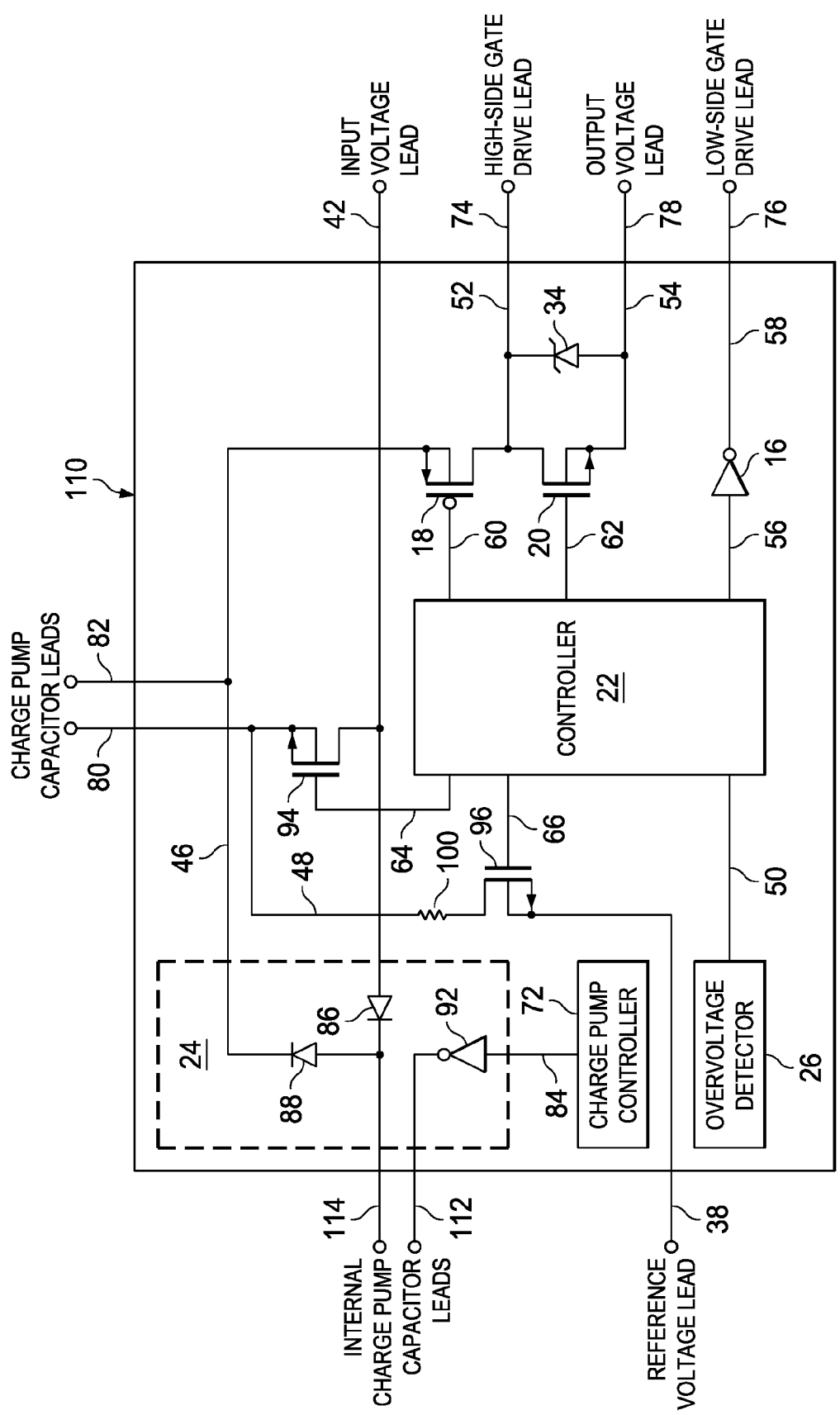
FIG. 4 is a block diagram illustrating an example integrated circuit that includes a power converter control circuit which may be used in the power converter of FIG. 3.

FIG. 4 is a block diagram illustrating an example integrated circuit 110 that includes a power converter control circuit which may be used in the power converter 10 of FIG. 3. Integrated circuit 110 in FIG. 4 is similar to power converter 10 of FIG. 3 except that: (1) switching transistors 12, 14, charge pump capacitor 32, inductor 36 and capacitor 90 are off-chip components that are not included in integrated circuit 110; (2) high-side gate drive lead 74, low-side gate drive lead 76, charge pump capacitor leads 80, 82 and internal charge pump capacitor leads 112, 114 are included to accommodate the off-chip components; and (3) charge pump controller 72 is included to control charge pump circuit 24. Same or similar components between FIGS. 2, 3 and 4 are numbered with identical reference numerals.

An output of charge pump controller 72 is coupled to an input of inverter 92 via conductor 84. An output of inverter 92 is coupled to internal charge pump capacitor lead 112. An anode of diode 86 is coupled to input voltage lead 42. A cathode of diode 86 is coupled to an anode of diode 88 and to internal charge pump capacitor lead 114. A cathode of diode 88 is coupled, via conductor 46, to charge pump capacitor lead 82 and to the high-side gate driver high voltage power supply input.

A drain electrode of transistor 94 is coupled to input voltage lead 42. A source electrode of transistor 94 is coupled to charge pump capacitor lead 80 via conductor 48. A source electrode of transistor 96 is coupled to reference voltage lead 38. A drain electrode of transistor 96 is coupled to charge pump capacitor lead 80 via resistor 100 and conductor 48. Resistor 100 is coupled between the second terminal of charge pump capacitor 32 and the drain electrode of transistor 96. Gate electrodes of transistors 94, 96 are coupled to respective outputs of controller 22 via conductors 64, 66, respectively.

Each of charge pump capacitor leads 80, 82 is configured to be coupled to a respective terminal of an external charge pump capacitor. Each of internal charge pump capacitor leads 112, 114 is configured to be coupled to a respective terminal of an off-chip capacitor that serves as an internal charge pump capacitor for charge pump circuit 24.

When the appropriate external components are connected to integrated circuit 110, the resulting system may operate in a manner similar to that which was already described above with respect to power converter 10 of FIG. 3. For purposes of brevity, the description of such operation will not be reproduced here.

Figure 5:
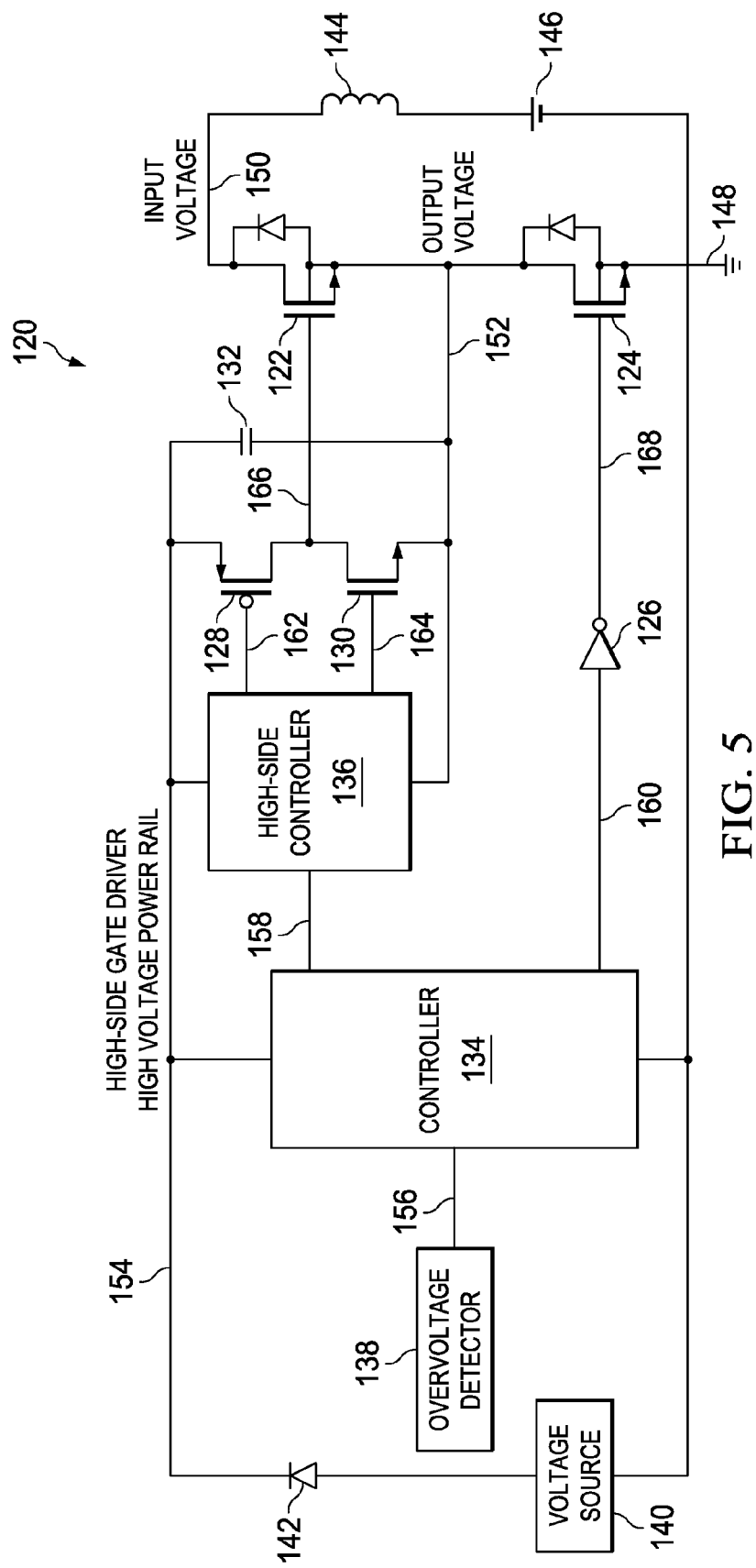
FIG. 5 is a block diagram illustrating another example power converter that includes an example power converter control circuit according to this disclosure.

FIG. 5 is a block diagram illustrating another example power converter 120 that includes an example power converter control circuit according to this disclosure. Power converter 120 includes switching transistors 122, 124, a low-side gate driver 126, transistors 128, 130, a capacitor 132, a controller 134, a high-side controller 136, an overvoltage detector 138, a voltage source 140, a diode 142, an inductor 144, a battery 146, a ground rail 148, and conductors 150, 152, 154, 156, 158, 160, 162, 164, 166, 168.

A source electrode of high-side switching transistor 122 is coupled to a drain electrode of low-side switching transistor 124 via conductor 152, which may form an output voltage lead for power converter 120. A drain electrode of high-side switching transistor 122 is coupled to conductor 150, which may form an input voltage lead for power converter 120. A source electrode of low-side switching transistor 124 is coupled to ground rail 148. Switching transistors 122, 124 may be said to be arranged in a totem-pole configuration, and may form a half-bridge circuit where conductor 150 forms the input voltage terminal, the source of low-side switching transistor 124 forms the ground return terminal, and conductor 152 forms the output voltage terminal. The drain electrode of high-side switching transistor 122 is coupled to an input voltage source such as, e.g., an automotive battery and/or an automotive alternator, represented by battery 146. Inductor 144 is coupled between the drain electrode of high-side switching transistor 122 a positive terminal of battery 146. A negative terminal of battery 146 is coupled to ground rail 148. The output voltage terminal formed by conductor 152 is configured to be coupled to one or more electronic load components, such as, e.g., one or more automotive electronic components and/or an electric motor.

The gate electrode of each of switching transistors 122, 124 is coupled to a respective gate driver circuit. Specifically, a gate electrode of high-side switching transistor 122 is coupled, via conductor 166, to an output of a high-side gate driver formed by transistors 128, 130. A gate electrode of low-side switching transistor 124 is coupled to an output of low-side gate driver 126 via conductor 168.

Back gate electrodes of each of switching transistors 122, 124 are coupled to their respective source electrodes via conductors. Internal diodes included in each of switching transistors 122, 124 are coupled between respective back gate and drain electrodes of switching transistors 122, 124 where the anodes are coupled to respective back gate electrodes and the cathodes are coupled to respective drain electrodes.

A drain electrode of transistor 128 is coupled to a drain electrode of transistor 130 via conductor 166. A source terminal of transistor 130 is coupled, via conductor 152, to the voltage output of the half-bridge circuit formed by switching transistors 122, 124. A source electrode of transistor 128 is coupled to a first terminal of capacitor 132 and a cathode of diode 142. Transistors 128, 130 may collectively form a high-side gate driver, which in some examples, may be an inverter.

The high-side gate driver formed by transistors 128, 130 includes a high voltage power input formed by the source of transistor 128 and coupled to conductor 154 (referred to herein as a high-side gate driver high voltage power rail). The high-side gate driver further includes a low voltage power input formed by the source of transistor 130 and coupled to the voltage output of the half-bridge circuit (referred to herein as a high-side gate driver low voltage power rail). Capacitor 132 is coupled between the high and low voltage power rails of the high-side gate driver via conductors 154 and 152, respectively.

The gate electrodes of transistors 128, 130 are coupled to respective outputs of high-side controller 136 via conductors 162, 164, respectively. Each of conductors 162, 164 may form an input to the high-side gate driver, and may be collectively referred to as a control input for the high-side gate driver.

An input of high-side controller 136 is coupled to an output of controller 134 via conductor 158. An input of low-side gate driver 126 is coupled to another output of controller 134 via conductor 160. In some examples, low-side gate driver 126 may be an inverter.

A power supply input of controller 134 is coupled to a first terminal of capacitor 132 and the cathode of diode 142 via conductor 154. A ground return of controller 134 is coupled to ground rail 148. A high voltage power supply input of high-side controller 136 is coupled to the first terminal of capacitor 132 and the cathode of diode 142 via conductor 154. A low voltage power supply input of high-side controller 136 is coupled to the output terminal of the half-bridge circuit via conductor 152.

A first terminal of voltage source 140 is coupled to ground rail 148. A second terminal of voltage source 140 is coupled to an anode of diode 142. A cathode of diode 142 is coupled, via conductor 154, to the power supply input of controller 134, the high voltage power supply input of high-side controller 136, the high voltage power supply input of the high-side gate driver formed by transistors 128, 130, and to the first terminal of capacitor 132.

Overvoltage detector 138 includes an input that is coupled to conductor 150 (not shown), and an output that is coupled to controller 134 via conductor 156. One or more of the components in FIG. 5 may be implemented on a common integrated circuit.

In the example of FIG. 5, switching transistors 122, 124 are both n-type metal-oxide-semiconductor (NMOS) power transistors. In other examples, each of switching transistors 122, 124 may be a MOS power transistor or a different type of transistor (e.g., insulated-gate bipolar junction transistor (IBJT)) with the same or different type of conductivity (e.g., p-type or n-type). Switching transistors 122, 124 need not be the same type or polarity of transistor with respect to each other.

Transistor 128 is a PMOS transistor, and transistor 130 is an NMOS transistor. In some examples, transistors 128, 130 may be relatively low-voltage transistors (i.e., non-power transistors). Other transistor configurations that are configured to implement an inverter and/or high-side gate driver may also be used.

Controller 134, high-side controller 136, and overvoltage detector 138 may be implemented with any combination of analog or digital circuitry, including for example, one or more microcontrollers.

Power converter 120 may be configurable to operate in a normal mode of operation and an overvoltage protection mode of operation. During the normal mode of operation, power converter 120 may provide control signals to alternatively turn switching transistors 122, 124 on and off according to synchronous buck converter control techniques and/or motor control techniques.

For example, controller 134 may provide control signals (e.g., pulse-width modulation (PWM) control signals) to the high-side gate driver formed by transistors 128, 130 (via high-side controller 136) and to low-side gate driver 126. In the example of FIG. 5, controller 134 may provide a high-side control signal to high-side controller 136. High-side controller 136 may provide the high side control signal to transistor 128 via conductor 162 and to transistor 130 via conductor 164. The high-side gate driver formed by overvoltage detector 138 may generate sufficient voltage and current to turn on and off high-side switching transistor 122 based on the high-side control signal provided by controller 134. Controller 134 may provide a low-side control signal to low-side gate driver 126 via conductor 160. Low-side gate driver 126 may generate sufficient voltage and current turn on and off low-side switching transistor 124 based on the low-side control signal provided by controller 134.

Transistors 128, 130 may act as an inverter with a floating ground power supply (i.e., conductor 152). For example, in response to receiving a high logic level voltage on conductors 162, 164, transistor 130 may turn on and transistor 128 may turn off. This may cause conductor 166 to be coupled to conductor 152, thereby turning off high-side switching transistor 122. In response to receiving a low logic level voltage on conductors 162, 164, transistor 130 may turn off and transistor 128 may turn on. This may cause conductor 166 to be coupled to the high-side gate driver high voltage power rail, thereby turning on high-side switching transistor 122.

Controller 134 may generate control signals that are appropriate for the intended use of power converter 120. For example, power converter 120 may generate control signals (e.g., PWM control signals) that cause switching transistors 122, 12, an additional inductor and an additional capacitor to act as a synchronous buck converter. In such examples, power converter 120 may generate the control signals based on a feedback signal indicative of the output voltage level relative to a target voltage level. As another example, power converter 120 may generate control signal (e.g., PWM control signals) that are configured to drive a single phase of a multi-phase electric motor. Other types of control signals and applications are also possible.

Voltage source 140 may provide a fixed voltage across the terminals of voltage source 140. In some examples, the fixed voltage may be greater than or equal to a gate-to-source turn-on threshold voltage for high-side switching transistor 122. During the normal mode of operation, when low-side switching transistor 124 is turned on and high-side switching transistor 122 is turned off, diode 142 may be forward-biased, thereby causing voltage source 140 to charge capacitor 132 through the current loop formed by diode 142, capacitor 132 and low-side switching transistor 124. In some examples, diode 142 may turn off if and when the voltage across capacitor 132 reaches a voltage approximately equal to the voltage across voltage source 140, thereby causing the charging of capacitor 132 to cease. When low-side switching transistor 124 is turned off and high-side switching transistor 122 is turned on, diode 142 may be reversed-biased. Consequently, when the output voltage at conductor 152 increases, the charge stored on capacitor 132 raises the voltage on the high-side gate driver high voltage power rail to a voltage greater than the output voltage. This may allow the high-side gate driver formed by transistors 128, 130 to provide a sufficient gate voltage for turning on high-side switching transistor 122.

During the normal mode of operation, overvoltage detector 138 may monitor the voltage level carried by an input voltage lead (e.g., conductor 150) and determine whether an overvoltage condition has occurred on the input voltage lead. In some examples, overvoltage detector 138 may determine that an overvoltage condition has occurred in response to detecting that the voltage carried by the input voltage lead is greater a threshold voltage. The threshold voltage may, in some cases, be less than or equal to a maximum compliance voltage for one or more of the components in power converter 120.

In some examples, the threshold voltage may be less than or equal to a maximum compliance voltage for one or more of the components in power converter 120. In further examples, the threshold voltage may be less than the peak overvoltage specified for the input voltage lead (e.g., conductor 150) minus a maximum voltage to which capacitor 132 is charged. In additional examples, the threshold voltage may be less than the peak overvoltage specified for the input voltage lead (e.g., conductor 150) minus a voltage across voltage source 140. In some examples, the peak overvoltage may correspond to a specified automotive load dump voltage level. Overvoltage detector 138 may generate a signal indicative of whether an overvoltage condition has occurred on the input voltage lead, and provide the signal to controller 134 via conductor 156.

In response to detecting an overvoltage condition, power converter 120 may transition from the normal mode of operation to an overvoltage protection mode of operation. During the overvoltage protection mode, controller 134 may, in some examples, turn off both of switching transistors 122, 124. An external inductor coupled to conductor 152 (not shown) may continue to draw current for a period of time after both of switching transistors 122, 124 are turned off, which may forward bias the internal diode in switching transistor 124, thereby pulling conductor 152 to ground and preventing the high voltage power rail of the high-side gate driver from increasing to voltage higher than the voltage carried by the input voltage lead. In other examples, controller 134 may turn off high-side switching transistor 122 and turn on low-side switching transistor 124.

In some examples, switching transistor 124 may be replaced by a diode with the anode coupled to ground rail 148 and the cathode coupled to the output voltage lead formed by conductor 152. In such examples, in response to detecting an overvoltage condition, controller 134 and/or controller 136 may turn off switching transistor 122.

Overvoltage detector 138 may continue to monitor the voltage level carried by the input voltage lead during the overvoltage protection mode, and determine when the overvoltage condition has ceased. In some examples, overvoltage detector 138 may determine that an overvoltage condition has ceased in response to detecting that the voltage carried by the input voltage lead is less than a threshold voltage. In response to detecting that an overvoltage condition has ceased, power converter 120 may resume alternatively switching transistors 122, 124 on and off according to one or more control techniques as described above.

Turning off the high-side and low-side power converter switches 122, 124 may prevent diode 142 and capacitor 132 from raising the power supply rail of the high-side gate driver to a voltage that is even greater than the voltage carried by the input voltage lead during the overvoltage condition. In this way, the voltage supplied to a high-side gate driver may be limited to levels that will not cause damage to the gate driver or other circuitry, even in cases where there is an overvoltage condition on the input voltage lead of power converter 120.

Reducing the level of voltage that is supplied to a high-side gate driver during an overvoltage condition may reduce the voltage compliance requirements needed for the components and/or the semiconductor fabrication process that implement power converter 120. This may allow existing components and processes to be used to implement power converters for relatively high input voltages which would otherwise not be possible with unmodified gate driver voltages. In this way, power converters that support relatively high-input voltages may be obtained without requiring specialized, very-high compliance voltage components and/or processes.

Moreover, reducing the voltage compliance requirements for the components and processes may allow cheaper and/or more area-efficient components and/or processes to be used for implementing a power converter. In this way, the cost and size of power converter 120 may be reduced.

Figure 6:
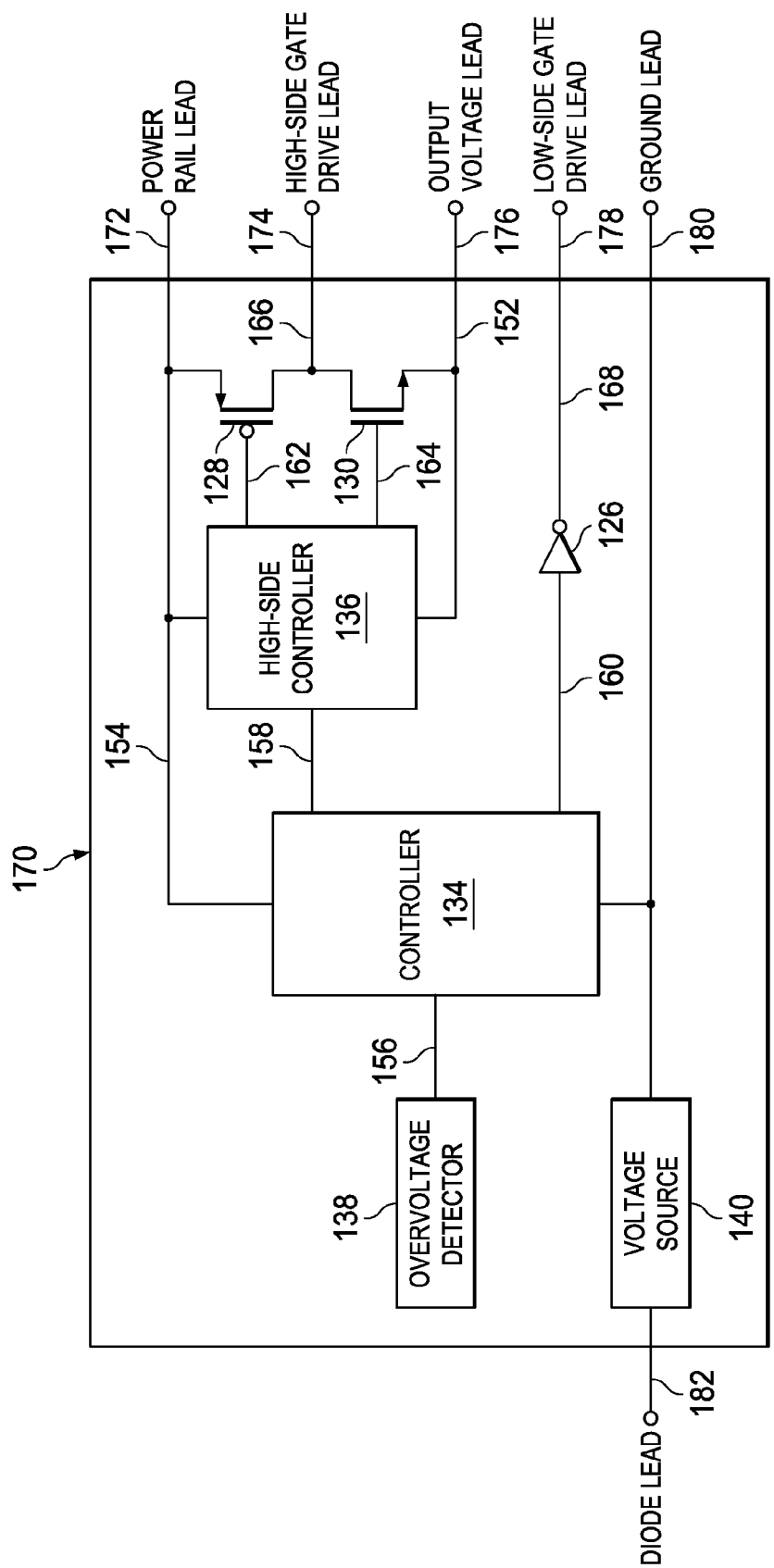
FIG. 6 is a block diagram illustrating an example integrated circuit that includes a power converter control circuit which may be used in the power converter of FIG. 5.

FIG. 6 is a block diagram illustrating an example integrated circuit 170 that includes a power converter control circuit which may be used in the power converter of FIG. 5. Integrated circuit 170 includes a low-side gate driver 126, transistors 128, 130, a controller 134, a high-side controller 136, an overvoltage detector 138, a voltage source 140, conductors 152, 154, 156, 158, 160, 162, 164, 166, 168 and leads 172, 174, 176, 178, 180, 182.

Integrated circuit 170 in FIG. 6 is similar to power converter 120 of FIG. 5 except that: (1) switching transistors 122, 124, capacitor 132, diode 142, inductor 144, and battery 146 are off-chip components that are not included in integrated circuit 170; and (2) leads 172, 174, 176, 178, 180, 82 are included to accommodate the off-chip components. Same or similar components between FIGS. 5 and 6 are numbered with identical reference numerals.

A source electrode of transistor 128 is coupled to power rail lead 172 via conductor 154. A source electrode of transistor 130 is coupled to output voltage lead 176 via conductor 152. A high voltage power supply input of high-side controller 136 is coupled to power rail lead 172 via conductor 154. A power supply input of controller 134 is coupled to power rail lead 172 via controller 134. A ground return terminal of voltage source 140 is coupled to ground lead 180. A ground return terminal of controller 134 is coupled to ground lead 180. An output terminal of low-side gate driver 126 is coupled to low-side gate drive lead 178 via conductor 168. An output of the high-side gate driver formed by transistors 128, 130 is coupled to high-side gate drive lead 174 via conductor 166.

Leads 172, 176 are configured to be coupled to respective terminals of a capacitor. Leads 172, 182 are configured to be coupled to respective terminals of a diode. Specifically, diode lead 182 is configured to be coupled to an anode of the diode, and power rail lead 172 is configured to be coupled to a cathode of the diode.

When the appropriate external components are connected to integrated circuit 170, the resulting system may operate in a manner similar to that which was already described above with respect to power converter 120 of FIG. 5. For purposes of brevity, the description of such operation will not be reproduced here.

Figure 7:
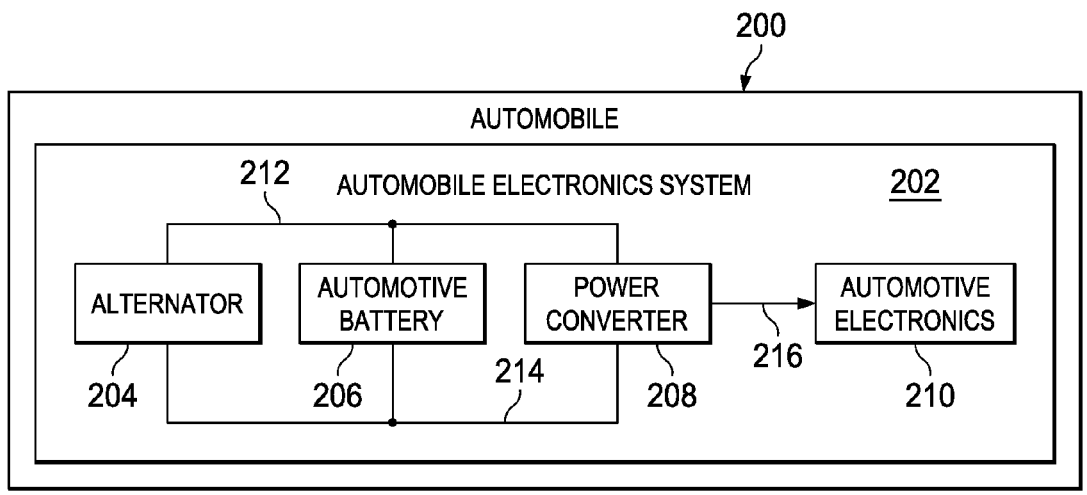
FIG. 7 is a block diagram illustrating an example automobile that may include a power converter designed according to the techniques of this disclosure.

FIG. 7 is a block diagram illustrating an example automobile 200 that may include a power converter designed according to the techniques of this disclosure. Automobile 200 includes an automobile electronics system 202. Automobile electronics system 202 includes an alternator 204, an automotive battery 206, a power converter 208, an automotive electronics 210, and leads 212, 214, 216.

Alternator 204, automotive battery 206, and power converter 208 are each coupled in parallel to each other via input voltage lead 212 and ground return lead 214. A power input of automotive electronics 210 is coupled to a power output (e.g., voltage output) of power converter 208 via output voltage lead 216. Power converter 208 may include any of the power converters described in this disclosure with respect to FIGS. 1-6 or any other power converter employing the techniques described in this disclosure.

Automotive electronics 210 may include any combination electronics suitable for use in an automobile. For example, automotive electronics 210 may include components of an automotive infotainment cluster, voice recognition components, heads-up display projection components, audio components, multimedia components, radio components, camera components, accessory components, heating components, air conditioning components, electric motors, lighting systems, security systems, battery charging systems, safety systems, air bag systems, etc.

Figure 8:
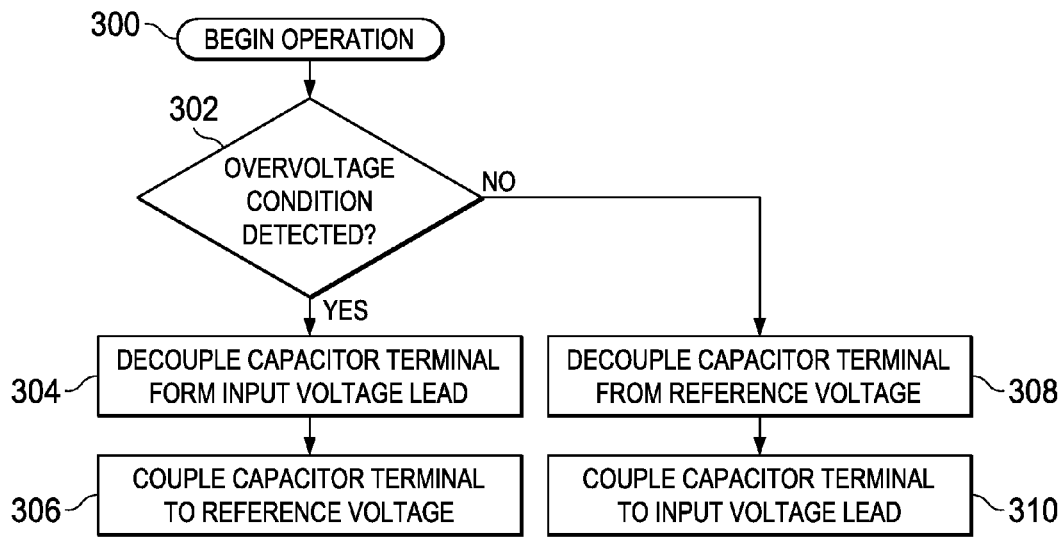
FIG. 8 is a flow diagram illustrating an example technique for controlling a power supply voltage of a high-side gate driver according to this disclosure.

FIG. 8 is a flow diagram illustrating an example technique for controlling a power supply voltage of a high-side gate driver according to this disclosure. The technique illustrated in FIG. 8 may be used with any of the power converters described with respect to FIGS. 1-4 of this disclosure.

Power converter 10 begins a power conversion operation (300). Power converter 10 determines whether an overvoltage condition has occurred on input voltage lead 42 (302). In response to determining that an overvoltage condition has occurred, controller 22 decouples the lower terminal of charge pump capacitor 32 from input voltage lead 42 (304), and couples the lower terminal of charge pump capacitor 32 to reference voltage lead 38 (306). In some examples (e.g., where charge pump capacitor 32 is an off-chip capacitor), controller 22 may decouple charge pump capacitor lead 80 from input voltage lead 42 (304), and couple charge pump capacitor lead 80 to reference voltage lead 38 (306).

In response to determining that an overvoltage condition has not occurred or that an overvoltage condition has ceased, controller 22 decouples the lower terminal of charge pump capacitor 32 from reference voltage lead 38 (308), and couples the lower terminal of charge pump capacitor 32 to input voltage lead 42 (310). In some examples (e.g., where charge pump capacitor 32 is an off-chip capacitor), controller 22 may decouple charge pump capacitor lead 80 from reference voltage lead 38 (308), and couple charge pump capacitor lead 80 to input voltage lead 42 (310).

Figure 9:
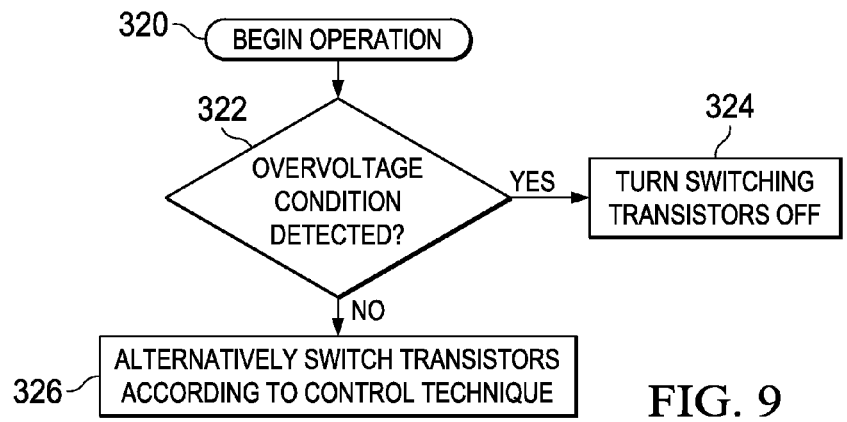
FIG. 9 is a flow diagram illustrating another example technique for controlling a power supply voltage of a high-side gate driver according to this disclosure.

FIG. 9 is a flow diagram illustrating another example technique for controlling a power supply voltage of a high-side gate driver according to this disclosure. The technique illustrated in FIG. 8 may be used with any of the power converters described with respect to FIGS. 5 and 6 of this disclosure.

Power converter 120 begins a power conversion operation (320). Power converter 120 determines whether an overvoltage condition has occurred on input voltage lead 42 (322). In response to determining that an overvoltage condition has occurred, controller 134 turns off both of switching transistors 122, 124 (324). In other examples, controller 134 may turn off high-side switching transistor 122 and turn on low-side switching transistor 124. In response to determining that an overvoltage condition has not occurred or that an overvoltage condition has ceased, controller 134 may alternatively switch switching transistors 122, 124 (e.g., alternatively turn on and off switching transistors 122, 124) according to a control technique (326).

Figure 10:
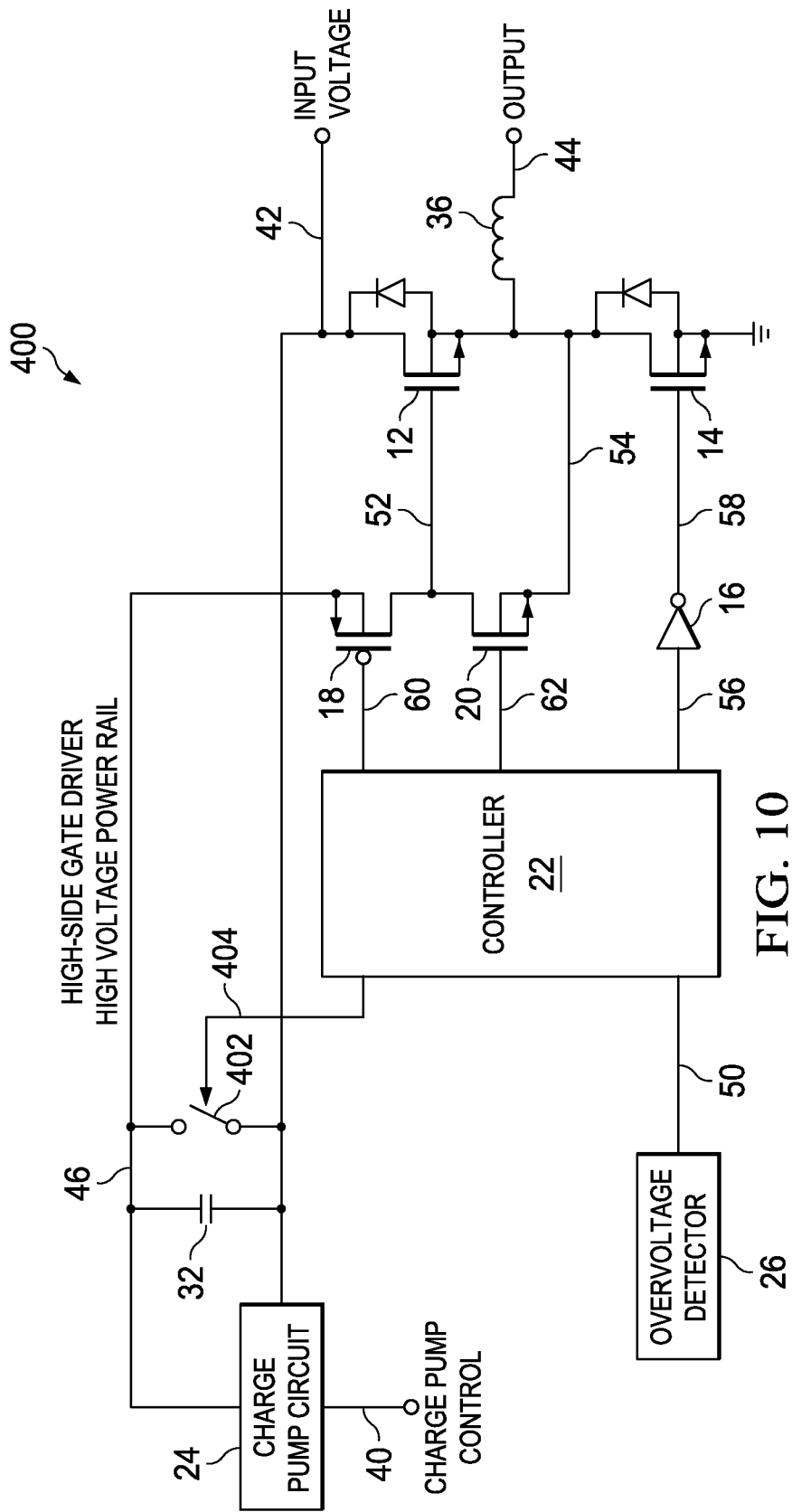
FIG. 10 is a block diagram illustrating another example power converter that includes an example power converter control circuit according to this disclosure.

FIG. 10 is a block diagram illustrating another example power converter 400 that includes an example power converter control circuit according to this disclosure. Power converter 400 in FIG. 3 is similar to power converter 10 of FIG. 1 except that: (1) switches 28, 30, reference voltage lead 38, and conductors 64, 68 are omitted; (2) charge pump capacitor 32 is coupled between conductor 46 and input voltage lead 42; (3) an additional switch 402 is coupled between conductor 46 and input voltage lead 42; and (4) a control lead 404 is coupled between controller 22 and switch 402. Same or similar components between FIGS. 1 and 10 are numbered with identical reference numerals.

Similar to the other power converters described in this disclosure, power converter 400 may operate in a normal mode and an overvoltage protection mode. During the normal mode of operation, controller 22 may open switch 402. This may allow charge pump circuit 40 to charge charge pump capacitor 32 in a manner similar to that which was described above with respect to the normal mode of operation for power converter 10 in FIG. 1.

In response to detecting an overvoltage condition for the voltage carried by input voltage lead 42, power converter 400 may transition to the overvoltage protection mode. To perform this transition, controller 22 may close switch 402, thereby discharging charge pump capacitor 32. Discharging charge pump capacitor 32 may prevent the high voltage power rail of the gate driver formed by transistors 18, 20 from exceeding the level of the input voltage carried by input voltage lead 42 during the overvoltage condition. In this way, power converter 400 may selectively discharge charge pump capacitor 32 in response to detecting an overvoltage condition.

In response to detecting that an overvoltage condition for the voltage carried by input voltage lead 42 has ceased, power converter 400 may transition to the normal mode of operation. To perform this transition, controller 22 may open switch 402, thereby allowing charge pump circuit 24 to charge charge pump capacitor 32.

In some examples, controller 22 may selectively close and open switch 402 based on whether an overvoltage condition has been detected for the voltage carried by input voltage lead 42. For example, controller 22 may close switch 402 in response to detecting an overvoltage condition, and open switch 402 in response to not detecting an overvoltage condition and/or in response to detecting that an overvoltage condition has ceased.

As shown in FIG. 2, an integrated circuit 70 includes a power converter 120, a high-side gate drive lead 74, a charge pump capacitor lead 80, a charge pump capacitor lead 82, and reference voltage lead 38. Integrated circuit 70 further includes charge pump circuitry (e.g., charge pump circuit 24), a gate driver (e.g., transistors 18, 20), a switching circuit (e.g., switches 28, 30) and an overvoltage detector 26. The charge pump circuitry has an input (e.g., input voltage lead 42), and an output coupled to charge pump capacitor lead 82. The gate driver has a control input (e.g., conductors 60, 62), a power input (e.g., source of transistor 18) coupled to the output of the charge pump circuitry, and an output coupled to high-side gate drive lead 74. The switching circuit has a control input (e.g., conductors 64, 66), a first terminal (e.g., lower terminal of switch 30) coupled to reference voltage lead 38, a second terminal (e.g., lower terminal of switch 28) coupled to input voltage lead 42, and a third terminal coupled to charge pump capacitor lead 80. Overvoltage detector 26 has an input coupled to input voltage lead 42, and an output coupled to the control input of the switching circuit (e.g., coupled to conductors 64, 66 via controller 22).

In some examples, the input of the charge pump circuitry is coupled to input voltage lead 42 and to the second terminal of the switching circuit (e.g., the lower terminal of switch 28). In further examples, a charge pump capacitor is coupled between charge pump capacitor leads 80, 82.

In additional examples, the gate driver is a high-side gate driver (e.g., transistors 18, 20), and the integrated circuit further includes a low-side gate driver 16. In such examples, the integrated circuit may further include a control circuit (e.g., controller 22) having a first output (e.g., conductors 60, 62) coupled to the control input of the high-side gate driver, and a second output (e.g., conductor 56) coupled to a control input of low-side gate driver 16.

In some examples, as shown in FIG. 4, the charge pump includes at least two diodes 86, 88 connected in series between the input (e.g., input voltage lead 42) and output (e.g., conductor 46) of the charge pump circuitry.

In further examples, as shown in FIG. 4, the switching circuit includes a transistor 94 having a first current conduction electrode coupled to input voltage lead 42, a second current conduction electrode coupled charge pump capacitor lead 80, and a control electrode coupled to the control input (e.g., conductor 64) of the switching circuit. In such examples, the switching circuit further includes a transistor 96 having a first current conduction electrode coupled to reference voltage lead 38, a second current conduction electrode coupled to charge pump capacitor lead 80, and a control electrode coupled to the control input of the switching circuit (e.g., conductor 66). In such examples, the switching circuit may, in some examples, further include a resistor 100 coupled between the second current conduction electrode of transistor 96 and charge pump capacitor lead 80.

In some examples, the switching circuit is configurable to operate in a first state that couples charge pump capacitor lead 80 to input voltage lead 42, and to operate in a second state that couples charge pump capacitor lead 80 to reference voltage lead 38. In such examples, the switching circuit may, in some examples, be configured to selectively operate in the first or second state based on the output of overvoltage detector 26. In further examples, the switching circuit is configured to selectively couple charge pump capacitor lead 80 to input voltage lead 42 or reference voltage lead 38 based on whether an overvoltage condition is detected for reference voltage lead 38.

In some examples, the switching circuit is configured to decouple charge pump capacitor lead 80 from input voltage lead 42 in response to detecting an overvoltage condition on input voltage lead 42. In such examples, the switching circuit may, in some examples, be further configured to couple charge pump capacitor lead 80 to reference voltage lead 38 in response to detecting an overvoltage condition on input voltage lead 42.

In some examples, the charge pump circuitry is configured to charge a charge pump capacitor until a voltage across the capacitor is equal to threshold voltage. In such examples, reference voltage lead 38 may be configured to receive a reference voltage that is less than or equal to a difference between a voltage carried by input voltage lead 42 during the overvoltage condition and the threshold voltage. In some examples, reference voltage lead 38 may be equal to the difference between a voltage carried by input voltage lead 42 and the threshold voltage.

As shown in FIGS. 2, 4 and 8, power converter 10 may selectively couple a charge pump capacitor lead 80 to an input voltage lead 42 or reference voltage lead 38 based on whether an overvoltage condition is detected for reference voltage lead 38. Reference voltage lead 38 may be coupled to a power supply input of a gate driver (e.g., source electrode of transistor 18).

In some examples, selectively coupling charge pump capacitor lead 80 may include decoupling charge pump capacitor lead 80 from input voltage lead 42 in response to detecting an overvoltage condition on input voltage lead 42, coupling charge pump capacitor lead 80 to reference voltage lead 38 in response to detecting an overvoltage condition on reference voltage lead 38. In some examples, reference voltage lead 38 may receive a reference voltage that is less than or equal to a difference between a voltage carried by input voltage lead 42 during the overvoltage condition and a maximum voltage to which charge pump circuit 24 is configured to charge charge pump capacitor 32. In some examples, the reference voltage is equal to the difference between the voltage carried by input voltage lead 42 and the maximum voltage.

As shown in FIG. 7, an automotive system (e.g., automobile electronics system 202) includes one or more automotive electronics 210, an automotive battery 206, an alternator 204 coupled to automotive battery 206, and a power supply rail (e.g., input voltage lead 212) coupled to alternator 204. The automotive system may further include a power converter 208 coupled between the power supply rail (e.g., input voltage lead 212) and automotive electronics 210.

Power converter 208 may include (FIGS. 1-4) a pass transistor (e.g., high-side switching transistor 12), a gate driver (e.g., transistors 18, 20) coupled to the pass transistor, and a capacitor (e.g., charge pump capacitor 32) having a first terminal coupled to a power input (e.g., source electrode of transistor 18) of the gate driver. Power converter 208 may further include circuitry (e.g. controller 22 and switches 28, 30) configured to decouple a second terminal of charge pump capacitor 32 from the power supply rail in response to detecting an overvoltage condition on the power supply rail, and to couple the second terminal charge pump capacitor 32 to a reference voltage lead in response to detecting the overvoltage condition on the power supply rail.

As shown in FIGS. 5 and 6, an integrated circuit 170 includes an input voltage lead 150, a high-side gate drive output lead 174, and a low-side gate drive output lead 178. The integrated circuit further includes a high-side gate driver (e.g., transistors 128, 130) having an input (e.g., conductors 158, 162 and/or 164), and an output (conductor 166) coupled to the high-side gate drive output lead. The integrated circuit further includes a low-side gate driver 126 having an input, and an output coupled to the low-side gate drive output lead. The integrated circuit further includes a control circuit (e.g., controller 134, high-side controller 136) having an input, a first output coupled to the input of the high-side gate driver, and a second output coupled to the input of the low-side gate driver. The integrated circuit further includes an overvoltage detection circuit (e.g., overvoltage detector 138) having an input coupled to the input voltage lead, and an output coupled to the input of the control circuit. The control circuit is configured to output a first control signal, via the first output, that causes a high-side switching transistor 122 to turn off in response to detecting an overvoltage condition for a voltage carried by the input voltage lead, and to output a second control signal, via the second output, that causes a low-side switching transistor 124 to turn off in response to detecting the overvoltage condition for the voltage carried by the input voltage lead.

In some examples, the first and second control signals are configured to cause the high-side and low-side switching transistors to both remain turned off for the duration of an overvoltage event. In further examples, a capacitor 132 is coupled between first and second power inputs of the high-side gate driver.

As shown in FIGS. 5, 6 and 9, power converter 120 may detect an overvoltage condition on an input voltage lead of a switch mode power converter 120 that includes a high-side switching transistor and a low-side switching transistor. Power converter 120 may turn off the high-side switching transistor and the low-side switching transistor in response to detecting the overvoltage condition. In some examples, power converter may turn off the high-side switching transistor and the low-side switching transistor such that both transistors remain turned off for a duration of or a portion of an overvoltage event.

In some examples, techniques of this disclosure may limit the maximum voltage transients that occur during an automotive load dump and/or limit the high voltage generated in an integrated circuit due to automotive load dump. In further examples, the techniques of this disclosure may switch a charge pump capacitor or boot strap capacitor.

In automotive load dump, the over voltage test battery voltage may be raised to a specified high voltage for a period of time. The may raise the voltage on the charge pump or boost strap pin to approximately 15-30V above the load dump voltage due to the charge pump or boot strap capacitor voltage and ringing. One way to deal with the increased voltage is to use components with higher compliance voltages for the integrated circuit (IC) and board, for IC internal isolation, and/or for internal components. Using components with higher voltage compliance ratings may be expensive in terms of cost to manufacture and device footprint.

This may be more pronounced in new 48V automotive battery systems. For example, at a 70V load dump, a power converter may see 85V to 100V, and consequently, need to use 90-105V components and a 90-105V process, which may require higher voltage processes. For a 12V system with a 40V load dump, a power converter may see 55V to 70V, and consequently need a 55 to 70V components and 55-70V process.

The techniques of this disclosure may limit the voltage on the power converter. In some examples, the voltage on all pins including charge pump and boot pins may be limited to have a maximum voltage of the battery load dump voltage. This may allow lower voltages on IC and board, and may reduce system cost. This may also allow use of the same process for 12V and 48V systems.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. An integrated circuit comprising:
   an input voltage lead;
   a high-side gate drive output lead;
   a first charge pump capacitor lead;
   a second charge pump capacitor lead;
   a reference voltage lead;
   charge pump circuitry having an input, and an output coupled to the second charge pump capacitor lead;
   a gate driver having a control input, a power input coupled to the output of the charge pump circuitry, and an output coupled to the high-side gate drive output lead;
   a switching circuit having a control input, a first terminal coupled to the reference voltage lead, a second terminal coupled to the input voltage lead, and a third terminal coupled to the first charge pump capacitor lead; and
   an overvoltage detection circuit having an input coupled to the input voltage lead, and an output coupled to the control input of the switching circuit.

2. The integrated circuit of claim 1, wherein the input of the charge pump circuitry is coupled to the input voltage lead and to the second terminal of the switching circuit.

3. The integrated circuit of claim 1, wherein a charge pump capacitor is coupled between the first and second charge pump capacitor leads.

4. The integrated circuit of claim 1, wherein the gate driver is a high-side gate driver, and wherein the integrated circuit further comprises a low-side gate driver.

5. The integrated circuit of claim 4, further comprising a control circuit having a first output coupled to the control input of the high-side gate driver, and a second output coupled to a control input of the low-side gate driver.

6. The integrated circuit of claim 1, wherein the charge pump circuitry includes at least two diodes connected in series between the input and output of the charge pump circuitry.

7. The integrated circuit of claim 1, wherein the switching circuit includes:
   a first transistor having a first current conduction electrode coupled to the input voltage lead, a second current conduction electrode coupled to the first charge pump capacitor lead, and a control electrode coupled to the control input of the switching circuit; and
   a second transistor having a first current conduction electrode coupled to the reference voltage lead, a second current conduction electrode coupled to the first charge pump capacitor lead, and a control electrode coupled to the control input of the switching circuit.

8. The integrated circuit of claim 7, wherein the switching circuit further includes a resistor coupled between the second current conduction electrode of the second transistor and the first charge pump capacitor lead.

9. The integrated circuit of claim 1, wherein the switching circuit is configurable to operate in a first state that couples the first charge pump capacitor lead to the input voltage lead, and to operate in a second state that couples the first charge pump capacitor lead to the reference voltage lead.

10. The integrated circuit of claim 9, wherein the switching circuit is configured to selectively operate in the first or second state based on the output of the overvoltage detection circuit.

11. The integrated circuit of claim 1, wherein the switching circuit is configured to selectively couple the first charge pump capacitor lead to the input voltage lead or the reference voltage lead based on whether an overvoltage condition is detected for the input voltage lead.

12. The integrated circuit of claim 1, wherein the switching circuit is configured to decouple the first charge pump capacitor lead from the input voltage lead in response to detecting an overvoltage condition on the input voltage lead.

13. The integrated circuit of claim 12, wherein the switching circuit is further configured to couple the first charge pump capacitor lead to the reference voltage lead in response to detecting the overvoltage condition on the input voltage lead.

14. The integrated circuit of claim 1,
wherein the charge pump circuitry is configured to charge a charge pump capacitor until a voltage across the charge pump capacitor is equal to a threshold voltage, and
wherein the reference voltage lead is configured to receive a reference voltage that is less than or equal to a difference between a voltage carried by the input voltage lead during the overvoltage condition and the threshold voltage.

15. The integrated circuit of claim 14, wherein the reference voltage lead is equal to the difference between the voltage carried by the input voltage lead and the threshold voltage.

16. The integrated circuit of claim 1, further comprising:
a switch coupled between the first and second charge pump capacitor leads; and
a control circuit configured to close the switch in response to detecting an overvoltage condition on the input voltage lead.

17. The integrated circuit of claim 1, further comprising:
a charge pump capacitor coupled between the first and second charge pump capacitor leads; and
a control circuit configured to discharge the charge pump capacitor in response to detecting an overvoltage condition on the input voltage lead.

\* \* \* \* \*